United States Patent
Kushibiki et al.

(10) Patent No.: US 7,256,135 B2
(45) Date of Patent: Aug. 14, 2007

(54) ETCHING METHOD AND COMPUTER STORAGE MEDIUM STORING PROGRAM FOR CONTROLLING SAME

(75) Inventors: Masato Kushibiki, Nirasaki (JP); Masayuki Sawataishi, Nirasaki (JP); Akitaka Shimizu, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 183 days.

(21) Appl. No.: 10/943,983

(22) Filed: Sep. 20, 2004

(65) Prior Publication Data

US 2005/0070111 A1    Mar. 31, 2005

(30) Foreign Application Priority Data

Sep. 29, 2003    (JP)    ............................. 2003-337373
Jun. 25, 2004    (JP)    ............................. 2004-188013

(51) Int. Cl.
    *H01L 21/302*    (2006.01)
(52) U.S. Cl. ...................... 438/725; 438/694; 438/723
(58) Field of Classification Search ............... 438/694, 438/695, 696, 700, 702, 703, 723, 725
See application file for complete search history.

(56) References Cited

U.S. PATENT DOCUMENTS

| | | | |
|---|---|---|---|
| 6,291,312 B1 * | 9/2001 | Chan et al. | 438/444 |
| 6,461,969 B1 * | 10/2002 | Lee et al. | 438/706 |
| 6,569,774 B1 * | 5/2003 | Trapp | 438/706 |
| 6,635,185 B2 * | 10/2003 | Demmin et al. | 216/64 |
| 6,955,961 B1 * | 10/2005 | Chung | 438/241 |
| 2004/0097077 A1 * | 5/2004 | Nallan et al. | 438/689 |
| 2004/0224524 A1 * | 11/2004 | Koenig et al. | 438/708 |

* cited by examiner

*Primary Examiner*—Kin-Chan Chen
(74) *Attorney, Agent, or Firm*—Oblon, Spivak, McClelland, Maier & Neustadt, P.C.

(57) ABSTRACT

An etching method of the present invention includes a first and a second process. In the first process, pattern widths of a pre-patterned mask layer are increased by depositing plasma reaction products on sidewalls of the mask layer. In the second process, a layer to be etched is etched by using the mask layer as a mask having increased the pattern widths. Therefore, mask layers having different pattern densities exist in the same wafer and pattern widths of mask layers patterned through a photolithography process are uneven according to pattern densities, each pattern width of the mask layers can be made uniform. Accordingly, the pattern widths of the layer can be made uniform over an entire wafer.

15 Claims, 9 Drawing Sheets

| | PATTERN WIDTH (nm) | | |
|---|---|---|---|
| | FIRST REGION (HIGH DENSITY) | SECOND REGION (LOW DENSITY) | DIFFERENCE IN PATTERN DENSITY |
| INITIAL STATE | 119.1 | 104.6 | −14.5 |
| END OF FIRST PROCESS | 134.6 | 134.8 | 0.2 |
| END OF SECOND PROCESS | 104.7 | 104.1 | −0.6 |

FIG.6

FIG.7 reg21 ←|→ reg22

| | PATTERN WIDTH (nm) | | |
|---|---|---|---|
| | FIRST REGION (HIGH DENSITY) | SECOND REGION (LOW DENSITY) | DIFFERENCE IN PATTERN DENSITY |
| INITIAL STATE | 114.9 | 126.4 | 11.5 |
| END OF FIRST PROCESS | 91.6 | 93.0 | 1.4 |
| END OF SECOND PROCESS | 64.4 | 63.0 | -1.4 |

ETCHING METHOD AND COMPUTER STORAGE MEDIUM STORING PROGRAM FOR CONTROLLING SAME

FIELD OF THE INVENTION

The present invention relates to an etching method and a computer readable storage medium storing therein a program for controlling same.

BACKGROUND OF THE INVENTION

In order to manufacture a semiconductor device, an etching process of forming desired fine patterns on a film formed on a semiconductor wafer (hereinafter referred to as a "wafer") is performed. In the etching process, a photolithography technology is employed to form fine pattern circuits. Specifically, a photoresist material is uniformly coated to a layer to be etched and dried, first. Thereafter, in an exposing step, a photoresist film is exposed to a light having a predetermined wavelength, and the fine pattern circuits are transferred thereto.

For example, in case where the photoresist material is of a positive type, the portions of the photoresist film, onto which the light has been irradiated, are removed by developing, thus forming a patterned mask layer. Subsequently, by performing a plasma etching process using the mask layer as a mask, the layer to be etched is etched into a desired pattern.

Figure 11A:
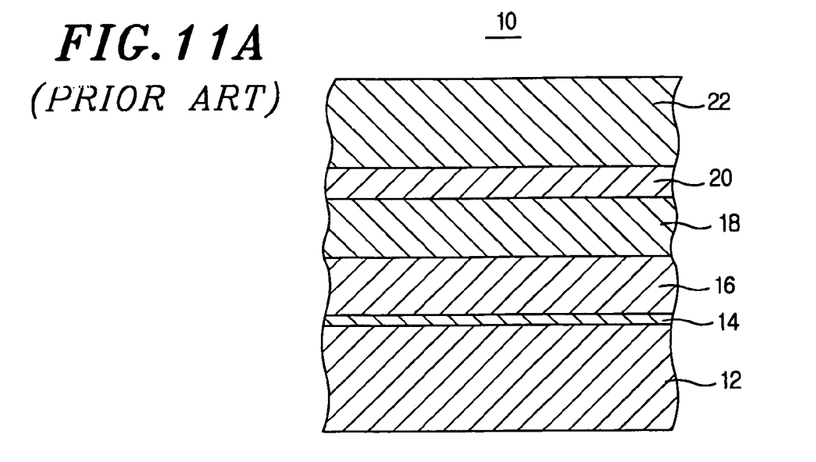
FIGS. 11A through 11C describe schematic cross sectional views of target objects, to which a conventional etching method is applied, in processes.

In a conventional exposure processing, if a light irradiated onto a photoresist film is diffusely reflected on an interface between the photoresist film and an under film, the light reaches regions of the photoresist film where it is not supposed to, thus possibly preventing a desired pattern form being obtained. In light of a current trend toward the fineness of circuit patterns and, particularly, its corresponding change of a light source from a KrF excimer laser (248 nm) to a short wave ArF excimer laser (193 nm), this phenomenon has been a problem. Accordingly, a film structure, in which a bottom anti-reflection coating (BARC) for absorbing an exposure light is placed below the photoresist film, has been generally employed. FIG. 11A shows an example of a film structure of a conventional semiconductor device 10, and FIGS. 11B and 11C illustrate manufacturing processes thereof.

As shown in FIG. 11A, an insulating layer 14 made of a silicon oxide film, a conductor layer 16 made of a polycrystalline silicon, and a hard mask layer 18 made of a TEOS (TetraEthyl OrthoSilicate) film, are placed on a wafer 12. In addition, a BARC 20 and a mask layer 22 that is made of a photoresist material are placed on the hard mask layer 18.

Figure 11B:
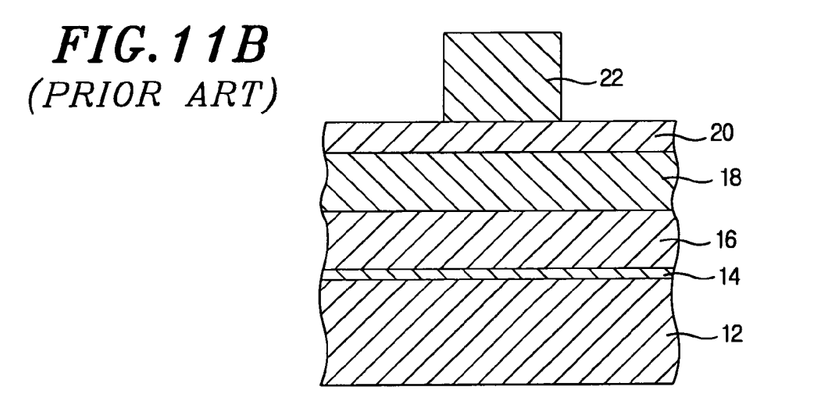
Figure 11C:
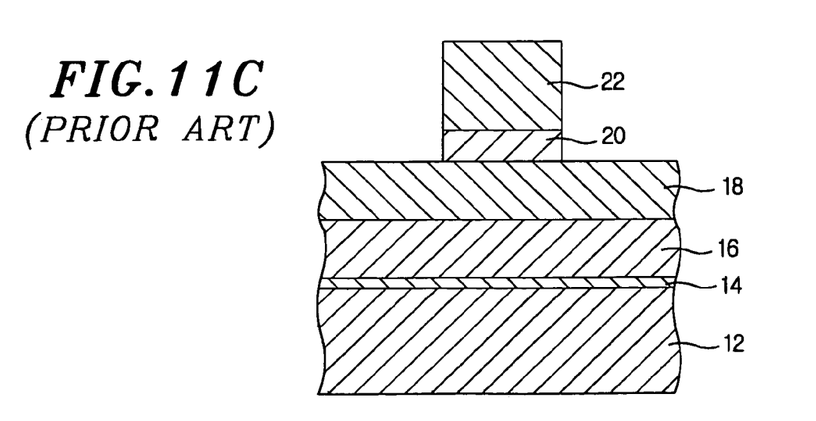

Exposure and developing are carried out on the mask layer 22 by using an exposure and developing devices, and as shown in FIG. 11B, the mask layer 22 is formed into a specific pattern. Then, the BARC 20 is selectively etched away by using a patterned mask layer 22 as a mask and performing a plasma etching process through the use of a specific processing gas, as shown in FIG. 11C.

Subsequently, the hard mask layer 18 is selectively etched away by using the mask layer 22 and the BARC 20 as masks (not shown). After the hard mask layer 18 is patterned as described above, an ashing is carried out to remove the mask layer 22 (and the BARC 20). And, the conductor layer 16 is selectively etched away by using the hard mask layer 18 as a mask. Thereafter, the semiconductor device 10 is finished through several processes.

Figure 12:
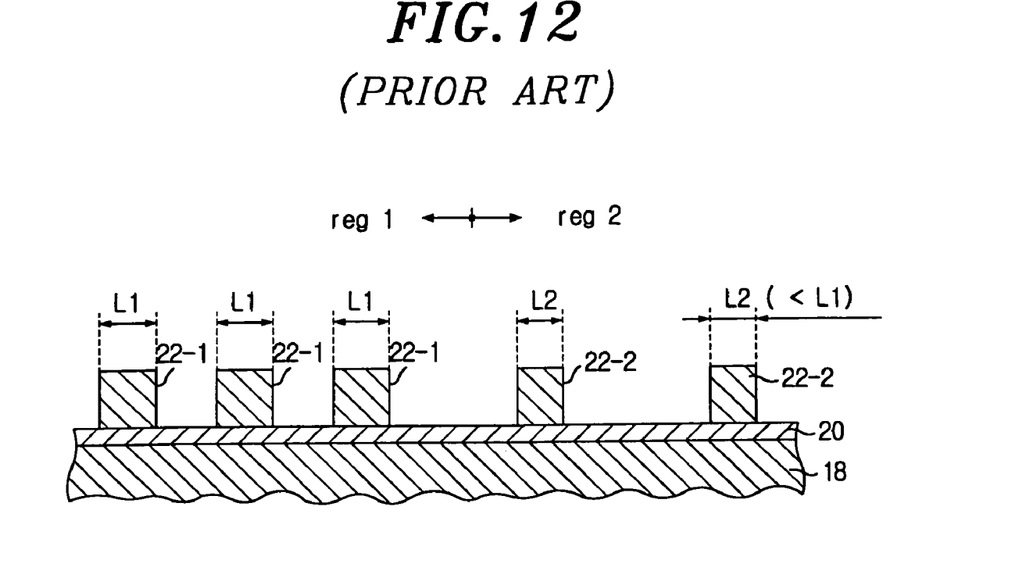
FIG. 12 illustrates a schematic cross sectional view of a patterned mask layer in a conventional photolithography process.

Yet, it cannot be said that pattern densities of circuit patterns, which are transferred onto the mask layer 22 in a photolithography process, are uniform over an entire wafer. As shown in FIG. 12, the patterned mask layer 22 may include a first and a second region, i.e., reg1 and reg2, where patterns in the first region are disposed closer to each other (the pattern density is high) than those in the second region (the pattern density is low), and widths of the patterns in the first region differ from those in the second region. If a difference in the pattern density of the mask layer 22 exists, sidewall shapes of the BARC, which is etched using each patterned mask layer 22 as a mask, may lack uniformity between the first and the second region, i.e., reg1 and reg2. The unevenness in the sidewall shapes of the BARC is hindrance to the fineness of the circuits. To address this problem, an attempt has been made by an invention disclosed in reference 1.

[reference 1] PCT International Publication 03/007357

However, in case where the difference in the pattern density of the mask layer exists, pattern widths in the patterned mask layer may be uneven due to the uneven pattern density despite the fact that lines in the mask-layer-patterning photo mask have identical width (pattern width) in the photolithography process.

For example, as shown in FIG. 12, while a mask layer 22-1 pertaining to the first region reg1 having a high pattern density may be patterned at a pattern width L1, a mask layer 22-2 pertaining to the second region reg2 having a low pattern density may be patterned at a pattern width L2 (<L1). Namely, the mask layer 22-1 is patterned at a width wider than that for the mask layer 22-2. Contrary to the configuration shown in FIG. 12, however, it is also possible that the mask layer 22-1 is patterned at a width narrower than that for the mask layer 22-2.

As described above, if the BARC 20 is selectively etched using the mask layers 22-1 and 22-2 of different pattern widths as masks and the etching process is performed on the hard mask layer 18 and its lower layers, deviations occur in the critical dimensions (CDs) of the circuit patterns. Thus, it is very difficult to make the performance of the semiconductor device uniform over the entire wafer.

Further, even though there is no deviation in the pattern widths of the patterned mask layer and the pattern widths are uniform, pattern density may still change the pattern width from a design value. Recently, a fine dimension level patterning, which is difficult to realize in the photolithography technology, is required. In any case, it is extremely difficult to meet the design value using the conventional technology.

SUMMARY OF THE INVENTION

It is, therefore, an object of the present invention to provide a novel and improved etching method and a computer readable storage medium storing therein a program for controlling the etching method, the etching method being capable of etching a target layer, which is masked by a mask layer, at a specific pattern width while adjusting one or more pattern widths of the mask layer.

In accordance the present invention, there are provided an etching method and a computer readable storage medium storing therein a program for controlling same, the etching method including the steps of: a first process for increasing pattern widths of a pre-patterned mask layer by depositing plasma reaction products on sidewalls of the mask layer; and a second process for etching a layer to be etched by using the mask layer as a mask having the increased pattern widths. According to this method, even though the pattern width of a previously patterned mask layer deviates from a design value, the deviation can be corrected. Further, it is preferable that the second process is performed by etching the layer to be etched while reducing the pattern widths of the mask layer by etching the sidewalls thereof. In the second process, the pattern widths of the mask layer are reduced, it is possible to adjust the pattern widths to a fine value. Still further, a processing gas of the first process includes at least any one of a CF based gas, a CHF based gas and a CH based gas. For example, when $CHF_3$ is used as a processing gas, the pattern widths of the mask layer are efficiently increased in the first process.

In accordance with the present invention, there are provided an etching method and a computer readable storage medium storing therein a program for controlling same, the etching method including the steps of: a first process for etching sidewalls of a pre-patterned mask layer to produce a processed mask layer with reduced pattern widths; and a second process for etching by using the processed mask layer as a mask a layer to be etched while further reducing the pattern widths of the processed mask layer by etching sidewalls thereof. Consequently, the pattern width of the mask layer can be formed at a design value. In the first and the second process, since the mask layer is transversely etched, the pattern width of the mask layer can be more fine. Further, it is preferable that a processing gas of the first process is an $O_2$ gas. In the first process, no power is applied to an electrode (for example, a lower electrode) on which an object to be processed, which includes the mask layer and the layer to be processed, is mounted, while a power is applied to other electrode (for example, an upper electrode). This induces ions within plasma to be drawn to the body to be processed and disappear. By the selection of such process conditions, the sidewalls of the mask layer can be efficiently etched in the first process.

Assuming that the mask layer includes a first and a second region where patterns in the first region are disposed closer to each other than those in the second region and widths of the patterns in the first region differ from those in the second region, it is preferable that the first process is performed by widening (or narrowing) the widths of the patterns in the first and the second region such that the widths of the patterns in the first region substantially coincide those in the second region. By making even the pattern widths of the mask layer like this, pattern widths of a layer to be etched can be consistent.

The mask layer may be made of a photoresist material. Further, this photoresist material may be photosensitive to an ArF light.

Meanwhile, the layer to be etched may be a bottom anti-reflection layer. The bottom anti-reflection layer may be an organic material.

In the second process, a processing gas of the second process may be a $CF_4$ gas and an $O_2$ gas. Further, in the second process, a processing gas of the second process may be a $CF_4$ gas.

The above-described mask layer may be provided with contact hole patterns. The first process may end when the pattern widths reach a target value while the pattern widths of the mask layer are monitored.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Preferred embodiments of the present invention will now be described in detail with reference to the accompanying drawings, wherein corresponding parts appearing in the attached drawings will be represented by the reference numerals to avoid redundant expression.

Figure 1:
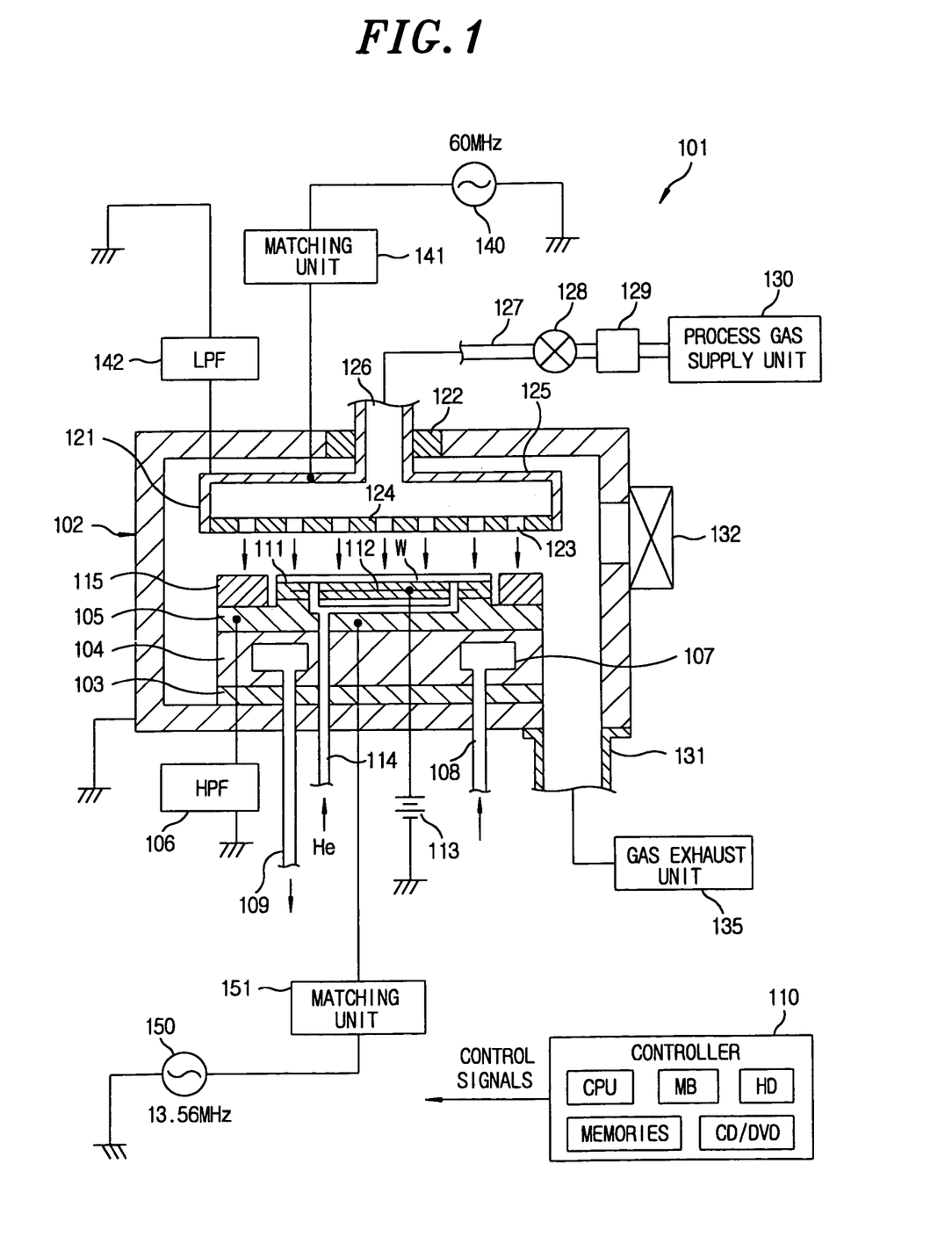
FIG. 1 shows a schematic construction of a plasma processing apparatus in accordance with a preferred embodiment of the present invention.

As an example of a plasma processing apparatus in accordance with the present invention, a schematic construction of a parallel plate type plasma processing apparatus 101 is illustrated in FIG. 1.

The plasma processing apparatus 101 has, e.g., a chamber (processing vessel) 102 made of aluminum, the surface of which is anodically oxidized (alumite processed). The chamber 102 is grounded. A susceptor support 104 for mounting a semiconductor wafer (hereinafter referred to as a "wafer") W as an object to be processed is placed on a bottom portion of the chamber 102, with an insulating plate 103, such as ceramic, being interposed therebetween. A susceptor 105 forming a lower electrode is provided on the susceptor support 104. A high pass filter HPF 106 is connected to the susceptor 105.

A temperature control medium space 107 is provided inside the susceptor support 104. A temperature control medium is introduced into the temperature control medium space 107 through an inlet line 108 for circulation therein before it is discharged through an exhaust line 109. By the circulation of the temperature control medium, the susceptor 105 can be adjusted at a desired temperature.

The susceptor 105 is formed in a disk shape, an upper central portion of which is protruded. An electrostatic chuck 111 having a shape substantially same as that of the wafer W is put on the susceptor 105. The electrostatic chuck 111 has a structure in which an electrode 112 is embedded in an insulating material. A direct current (DC) voltage, e.g., 2.5 kV, is applied to the electrostatic chuck 111 from a DC power supply 113 connected to the electrode 112. By this, the wafer W is electrostactically adsorbed onto the electrostatic chuck 111.

A gas channel 114 for supplying a heat transfer medium (e.g., a backside gas, such as He gas or the like) to a rear surface of the wafer W is formed on the insulating plate 103, the susceptor support 104, the susceptor 105 and the electrostatic chuck 111. Through the heat transfer medium, heat transfer is performed between the susceptor 105 and the wafer W, and the wafer W is maintained at a specific temperature.

A ring-shaped focus ring 115 is disposed on the upper periphery portion of the susceptor 105 so as to surround the wafer W mounted on the electrostatic chuck 111. The focus ring 115 is made of an insulating material, such as a ceramic or a quartz, or a conductive material. By the placement of the focus ring 115, an etching uniformity can be improved.

Meanwhile, an upper electrode 121 is provided above and parallel to the susceptor 105 to face it. The upper electrode 121 is supported in the chamber 102 with the assistance of an insulating material 122. The upper electrode 121 includes an electrode plate 124 forming a facing surface to the susceptor 105 and having a plurality of injection openings 123, and an electrode support 125 for supporting the electrode plate 124. The electrode plate 124 is made of, e.g., a quartz, and the electrode support 125 is made of, e.g., a conductive material, such as aluminum, the surface of which is alumite processed. A distance between the susceptor 105 and the upper electrode 121 can be adjusted.

A gas inlet opening 126 is formed through the central portion of the electrode support 125 in the upper electrode 121. A gas supply line 127 is connected to the gas inlet opening 126. Further, a processing gas supply source 130 is connected to the gas supply line 127 through a valve 128 and a mass flow controller 129.

The processing gas supply source 130 is configured to supply an etching gas for a plasma etching. Although, in FIG. 1, a single processing gas supply system including the gas supply line 127, the valve 128, the mass flow controller 129 and the processing gas supply source 130 is illustrated, the plasma processing apparatus 101 may have a plurality of processing gas supply systems. For example, processing gases, e.g., $CF_4$, $CHF_3$, $CH_4$, $CH_4O_2$, $N_2$, Ar, He, Xe, and the like, are supplied to the chamber 102 while flow rates thereof are independently controlled.

An exhaust line 131 is connected to the bottom portion of the chamber 102, and a gas exhaust unit 135 is connected to the exhaust line 131. The gas exhaust unit 135 has a vacuum pump such as a turbo molecular pump, and adjusts an inside of the chamber 102 to a depressurized environment (e.g., equal to or less than 0.67 Pa). A gate valve 132 is installed on a sidewall of the chamber 102. By opening the gate valve 132, the wafer W can be loaded and unloaded into and out of the chamber 102. A wafer cassette W is used for transferring the wafer W.

A first high frequency power supply 140 is connected to the upper electrode 121, and a first matching unit 141 is installed in a feeder line between the first high frequency power supply 140 and the upper electrode 121. A low pass filter LPF 142 is connected to the upper electrode 121. The first high frequency power supply 140 can output a power having a frequency in a range from 50 to 150 MHz. By the application of the power having such a high frequency to the upper electrode 121, the inside of the chamber 102 can be put in a desirable dissociative state and a high density plasma can be produced therein. This enables a plasma processing to be performed at a lower pressure than before. The frequency of the output power of the first high frequency power supply 140 is preferably 50 to 80 MHz, and typically, adjusted to about 60 MHz, as shown in the drawing.

A second high frequency power supply 150 is connected to the susceptor 105 of the lower electrode, and a second matching unit 151 is installed in a feeder line between the susceptor 105 and the second high frequency power supply 150. The second frequency power supply 150 can output a power having a frequency in a range from several hundreds of kHz to less than 20 MHz. By the application of the power having a frequency in such a range to the susceptor 105, an appropriate ion action is applied to the wafer W without damage. The frequency of the output power of the second high frequency power supply 150 is typically adjusted to 2 MHz or 13.56 MHz, as shown in the drawing.

The plasma processing apparatus 101 further includes a controller 110. The controller 110 preferably controls processes carried out by the apparatus 101 in a completely automated manner by way of controlling, e.g., flow rates of the temperature control medium and the heat transfer medium and operations of electrical and mechanical components, e.g., the filters 106 and 142, the matching units 141 and 151, the power supplies 113, 140 and 150, the valves 128 and 132, the MFC 129 and the gas exhaust unit 135. The controller 110 can be implemented by a general purpose computer, e.g., pc, which has a CPU, a mother board (MB), a hard disk (HD), memories such as ROM and RAM, and a CD/DVD drive. The process control can be carried out under the control of a control program or a software running on the controller 110. Though not specifically depicted in FIG. 1, control signals are provided from the controller 110 to the aforementioned electrical and mechanical components via controller lines (not shown). It should be apparent to those skilled in the art that the control of the electrical and mechanical components can be executed through the use of actuators equipped in those components. Further, though not shown in FIG. 1, the plasma processing apparatus 101 can be equipped with various sensors needed to monitor process parameters, such as a temperature of the susceptor 105 and a chamber pressure, for the control thereof and monitored signals from the sensors can be fed to the controller 110. The control program can be programmed on the controller 110 or can be provided thereto from outside via, e.g., a network or the CD/DVD drive and then stored in, e.g., the hard disk for the execution thereof.

Next, an example of an object to be etched by the plasma processing apparatus 101 shown in FIG. 1 will be discussed with reference to FIG. 2.

Figure 2:
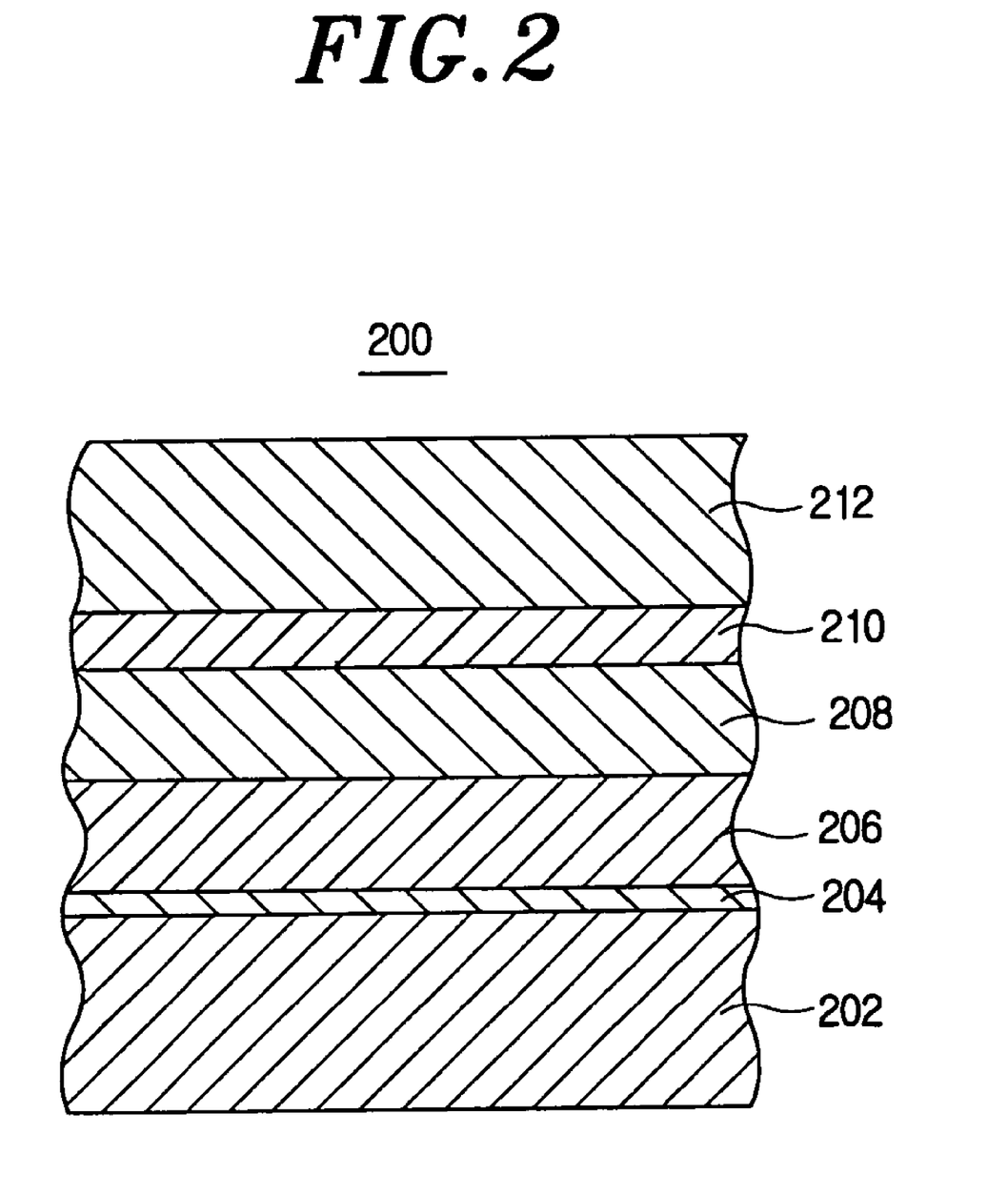
FIG. 2 describes a schematic cross sectional view for showing a film structure of an object to be etched by the plasma processing apparatus shown in FIG. 1.

As shown in FIG. 2, an object to be processed 200 includes an insulating layer 204, a conductor layer 206 and a hard mask layer 208 sequentially laminated on a wafer 202, and further includes a BARC 210 and a mask layer 212, which is made of a photoresist material, on the hard mask layer 208.

A photoresist material forming the mask layer 212 is photosensitive to, e.g., an ArF light (wavelength 193 nm), and a thickness thereof is 300 nm.

The BARC 210 functions to suppress a light reflected from a base layer when the mask layer 212 is exposed to the light such as the ArF light. This enables more fine patterning. In this case, the film thickness of the BARC is 90 nm.

The hard mask layer 208 is made of, e.g., a TEOS (TetraEthyl Orthosilicate), and selectively etched using a patterned mask layer 212 and the BARC 210 as masks. The conductor layer 206 disposed below the hard mask layer 208 is selectively etched using a patterned hard mask layer 208. In this case, the thickness of the hard mask layer is 50 nm.

The conductor layer 206 is made of, e.g., a polycrystalline silicon, and the thickness thereof is 150 nm. The insulating layer 204 is made of, e.g., a silicon oxide film, and the thickness thereof is 2 nm. For example, in case of making a transistor from the object 200, the conductor layer 206 forms a drain electrode and a source electrode while the insulating layer 204 forms a gate oxide film.

The object 200 having such a film structure undergoes the photolithography process before being etched by the plasma processing apparatus 101. The photolithography process is performed on the mask layer 212, and, for example, a line and space pattern is formed on the mask layer 212.

Figure 3A:
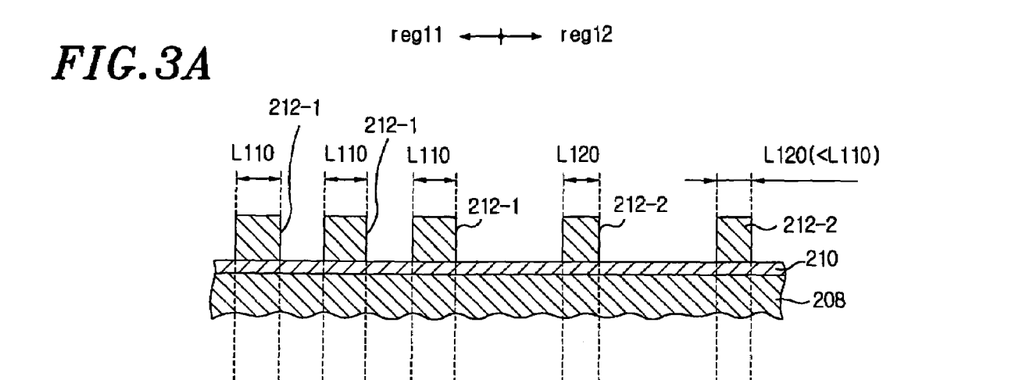
FIGS. 3A through 3C are schematic cross sectional views of target objects, to which an etching method in accordance with a first embodiment is applied, in processes.

A longitudinal cross section of the object 200 when the photolithography process has been performed is shown in FIG. 3A. As shown in FIG. 3A, the patterned mask layer 212 includes a first and a second region, i.e., reg11 and reg12, where patterns in the first region are disposed closer to each other (the pattern density is high) than those in the second region (the pattern density is low). In this case, a mask layer 212-1 pertaining to the first region reg11 is formed in a 1:1 line and space pattern (line width: gap width=1:1), and a mask layer 212-2 pertaining to the second region reg12 is formed in a 1:10 line and space pattern (line width: gap width=1:10).

Meanwhile, if the mask layer 212 is patterned using the photolithography technology, a critical dimensional (CD) shift may occur between the line width of the photo mask and that of the mask layer 212. Further, CD shift levels may vary according to the densities of patterns transferred onto the mask layer 212. In the example shown in FIG. 3A, a pattern width L120 of the mask layer 212-2 pertaining to the second region reg12 is narrower than a pattern width L110 of the mask layer 212-1 pertaining to the first region reg11.

Since each of the layers disposed below the mask layer 212 is etched according to the patterns of the mask layer 212, a deviation in the critical dimensions (CDs) of circuit patterns may occur in the case where the pattern widths of the mask layer 212 are uneven according to the pattern densities. Further, it is extremely difficult to make a performance of a manufactured semiconductor device uniform over an entire wafer.

In accordance with the present invention, even in case where the deviation exists in the pattern widths of the mask layer 212 patterned by using the photolithography technology, it is possible to eliminate the deviation and form an even circuit over the entire wafer. Hereinafter, an etching method in accordance with a first embodiment of the present invention will be explained.

First Embodiment

In the present embodiment, a mask layer 212 is used as a mask, and a plasma etching process is performed selectively on a BARC (a layer to be etched) 210 disposed below the mask layer 212. The plasma etching process is performed in at least two processes (first and second processes) having different process conditions.

Figure 3B:
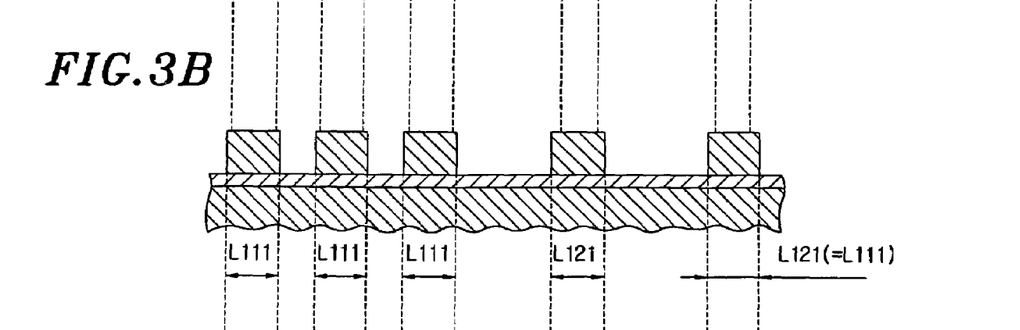

First, reaction products are deposited on sidewalls of a pre-patterned mask layer 212 prepared by using a photolithography process, and process conditions are set to increase each pattern width. Further, the process conditions are set to allow a pattern width L110 of a mask layer 212-1 pertaining to a first region reg11 and a pattern width L120 of a mask layer 212-2 pertaining to a second region reg12 to coincide with each other at the end of the first process as well as to increase the pattern widths. An example of detailed conditions of the first process is described below. Further, in the first process, the BARC 210, which is masked by the mask layer 212, is scarcely etched.

processing gas: $CHF_3$ (flow rate 200 sccm)
inner pressure of chamber: 10 mTorr
high frequency power to be applied to upper electrode: 200 W
high frequency power to be applied to lower electrode: 100 W
He gas pressure (center/edge): 3/3 Torr
temperature inside chamber (top/wall/bottom): 80/60/30° C.
etching time: 185 sec When the first process is performed under the above-described process conditions, the pattern width L110 of the mask layer 212-1 pertaining to the first region reg11 increases to a pattern width L111 and the pattern width L120 of the mask layer 212-2 pertaining to the second region reg12 increases to a pattern width L121. However, larger amount of reaction products are deposited on a sidewall of the mask layer 212-2 pertaining to the second region reg12 and an increase rate in the pattern width thereof is higher, as compared with the mask layer 212-1 pertaining to the first region reg11. As a result, the pattern width L110 of the mask layer 212-1 pertaining to the first region reg11 and the pattern width L120 of the mask layer 212-2 pertaining to the second region reg12, which were initially different from each other, are changed to a pattern width L111 and a pattern width L121 (=L111) of same size at the end of the first process.

Figure 4:
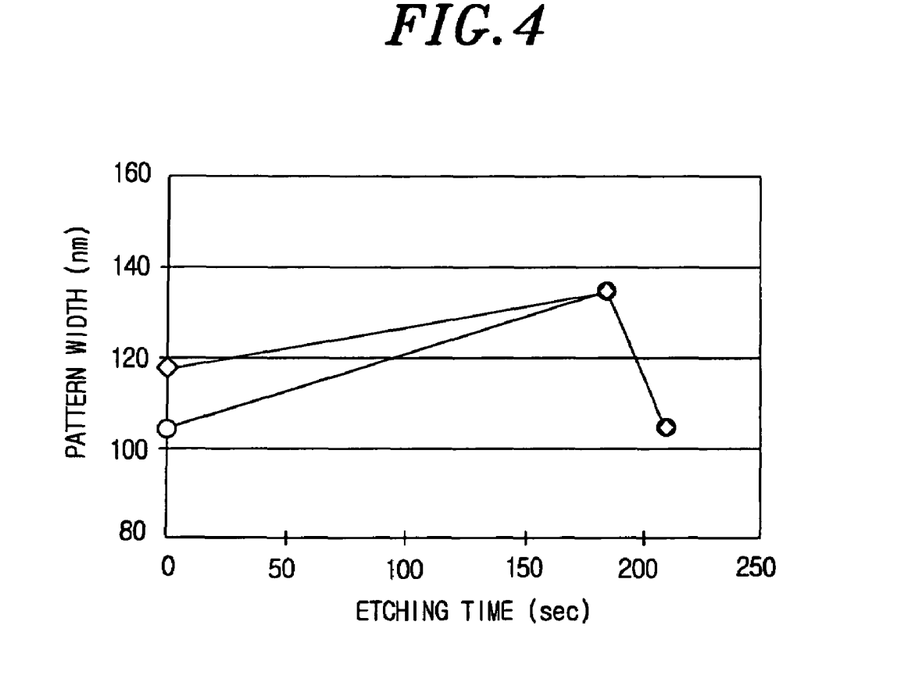
FIG. 4 illustrates a graph showing a relationship between an etching time and a pattern width when the etching method in accordance with the first embodiment is performed.

FIG. 4 illustrates a relationship between an etching time ("deposition time" in the first process) and pattern widths of the mask layer 212. In FIG. 4, the line showing pattern width of the mask layer 212-1 pertaining to the first region reg11 is plotted with ◇, and that of the mask layer 212-2 pertaining to the second region reg12 is plotted with ○. As shown in FIG. 4, the pattern width of the mask layer 212-2 substantially catches up with that of the mask layer 212-1 when an etching time of 185 sec has elapsed. The etching time of the first process (185 sec) may be determined based on, e.g., the following method.

A pattern width (an initial value) of a mask layer is measured in advance by using a wafer sample having the same film structure. Thereafter, a first process is performed under the same process conditions, and stopped after an appropriate time to measure the pattern width of the mask layer. A difference between the measured patterned width and the initial value is obtained. Next, increasing rates (slopes of plotted segments) in the pattern widths of the mask layer in the first process are calculated by using this difference in pattern width and the processing time. Since, in the present embodiment, a mask layer pertaining to a high pattern density region and a mask layer pertaining to a low pattern density region are different in increase rates of pattern widths, the lines of the pattern widths of the mask layers are bound to meet each other after an elapse of a certain time (the segments intersect each other). The elapsed time is set to a first processing time. In the present embodiment, the processing time is 185 sec. By changing various process parameters, the etching time (first processing time) can be adjusted.

Figure 5:
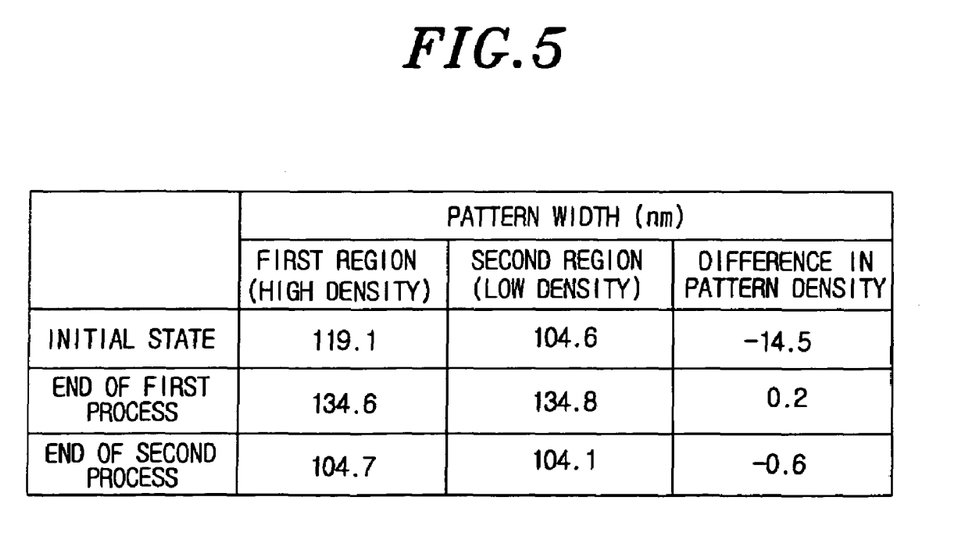
FIG. 5 presents a table showing results obtained by measuring pattern widths that have been changed by performing the etching method in accordance with the first embodiment.

FIG. 5 shows results obtained by measuring the pattern widths of the mask layer 212-1 pertaining to the first region reg11 and the mask layer 212-2 pertaining to the second region reg12.

At an initial state, i.e., when the photolithography process has been completed, the pattern width L110 of the mask layer 212-1 pertaining to the first region reg11 is 119.1 nm, while the pattern width L120 of the mask layer 212-2 pertaining to the second region reg12 is 104.6 nm, that is, relatively narrow. The difference therebetween is −14.5 nm.

If the first process of the etching method in accordance with the present embodiment is performed, the pattern width L110 of the mask layer 212-1 pertaining to the first region reg11 increases to 134.6 nm (L111), and the pattern width L120 of the mask layer 212-2 pertaining to the second region reg12 increases to 134.8 nm (L121). At this time, since the increasing rate in the pattern width of the mask layer 212-2 pertaining to the second region reg12 is larger than that in the pattern width of the mask layer 212-1 pertaining to the first region reg11, the difference between the two pattern widths is 0.2 nm. The difference is so small that the pattern width L211 of the mask layer 212-1 pertaining to the first region reg11 can be regarded as being substantially equal to the pattern width L120 of the mask layer 212-2 pertaining to the second region reg12.

Meanwhile, in the photolithography process, if a line and space pattern is formed on the make layer made of a photoresist material, a line end (sidewall portion) is not finished in a rectilinear form, but a slight roughness (undulation) occurs. That is generally called as a line edge roughness (LER). The LER is generally small as about several nm, but this value cannot be ignored as patterns become minute. In order to manufacture more minute semiconductor devices of higher performance, it is necessary to reduce the LER. From this point of view, in accordance with the present embodiment, the pattern widths of the mask layers 212-1 and 212-2 increase in the first process, to thereby achieve the flattening of the line end.

As descried above, at the end of the first process, the pattern widths of the mask layer 212 are made uniform and the LER is reduced regardless of the pattern density. In following second process, the BARC 210 is etched using the mask layer 212, on which the pattern widths are uniform, as a mask.

In the second process, the reduction of the pattern widths of the mask layer 212, which were increased in the first process, is carried out as well as the longitudinal etching of the BARC 210. Namely, a transverse etching process (so-called a trimming) is also performed on the mask layer 212. The trimming is performed according to the pattern width of the mask layer 212 at the end of the first process. For example, in case where the pattern width that was increased in the first process is wider than that of a finally desired circuit pattern of the semiconductor device, the trimming is preferably carried out. In the present embodiment, an etching process on the BARC 210 and the trimming on the mask layer 212 are performed together.

The process conditions of the second process are set in view of not only the etching process on the BARC 210 but also the requirement that the pattern width of the mask layer 212-1 pertaining to the first region reg21 and that of the mask layer 212-2 pertaining to the second region reg22 be reduced at the same rate when the trimming is performed on the mask layer 212 in the second process, unlike the first process. An example of detailed process conditions of the second process is described below.

processing gas: $CF_4$ (flow rate 40 sccm)+$O_2$ (flow rate 40 sccm)

inner pressure of chamber: 20 mTorr high frequency power to be applied to upper electrode: 600 W high frequency power to be applied to lower electrode: 100 W overetching: 10%

Further, in the second process, after the exposure of a base layer disposed below the BARC 210 (here, the hard mask layer 208) is detected, 10% overetching is performed as described above and the etching process is completed.

Figure 3C:
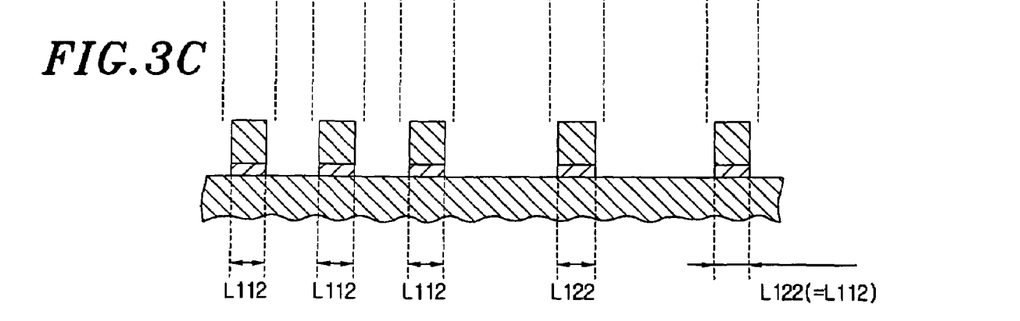

When the second process is performed under the above-described process conditions, the pattern width L111 of the mask layer 212-1 pertaining to the first region reg11 is reduced to a pattern width L112, and the pattern width L121 of the mask layer 212-2 pertaining to the second region reg12 is reduced to a pattern width L122, as shown in FIG. 3C. Further, the reduction rate is uniform regardless of the pattern density of the mask layer 122. As a result, the pattern width L112 and the pattern width L122 remains the same as to each other at the end of the second process.

Further, in the second process, the BARC 210 is etched using the mask layer 212-1 having the pattern width L112 and the mask layer 212-2 having the pattern width L122 as masks. Accordingly, the pattern widths of the BARC 210 are uniform over an entire wafer regardless of the pattern density.

Here, FIGS. 4 and 5 are referred to again. As shown in FIG. 4, the pattern width increased in the first process is reduced at a constant rate regardless of the pattern density. When the second process is completed, the pattern width of the mask layer 212-1 (and the BARC 210) and that of the mask layer 212-2 (and the BARC 210) are substantially same.

FIG. 5 shows results obtained by measuring the pattern width L112 of the mask layer 212-1 pertaining to the first region reg11 and the pattern width L122 of the mask layer 212-2 pertaining to the second region reg12. If the second process of the etching method according to the present embodiment is performed, the pattern width of the mask layer 212-1 pertaining to the first region reg11 is reduced to 104.7 nm and that of the mask layer 212-2 pertaining to the second region reg12 is reduced to 104.1 nm. Thus, the difference between the both pattern widths becomes −0.6 nm. This value is so small that the pattern width L112 of the mask layer 212-1 pertaining to the first region reg11 can be regarded as being substantially equal to the pattern width L122 of the mask layer 212-2 pertaining to the second region reg12.

As described above, in accordance with the etching method of the first embodiment, the pattern widths of the mask layer 212 are increased in the first process, and reduced to a predetermined value in the second process. Particularly, the pattern widths of the mask layer 212 are increased at different rates according to the pattern density in the first process, until the pattern widths of the mask layer 212 become uniform regardless of the pattern density. Accordingly, even in case where the pattern widths of the mask layer 212 are different due to the pattern density at the initial state, the pattern widths of the BARC 210 can be uniformly adjusted.

Further, in accordance with the etching method of the first embodiment, even though each of the pattern widths of the mask layer 212 has a large CD shift at the initial state, it may be possible that the pattern width of the mask layer 212 is increased wider than a design value in the first process and adjusted to the design value in the second process. As a result, extremely fine circuit patterns can be formed and dimensional errors of the circuit patterns can be suppressed to minimum.

However, in case of actual wafers (objects to be processed), pattern density regions of the mask layer are rarely divided into two, as shown in FIGS. 3A to 3C. Typically, many pattern density regions exist on a single wafer. In accordance with the present invention, with respect to wafers on which many variations in pattern densities of a mask layer exist, the same operation and effect can be obtained. Experimental results by which the above fact is verified are illustrated in FIGS. 6 and 7.

Figure 6:
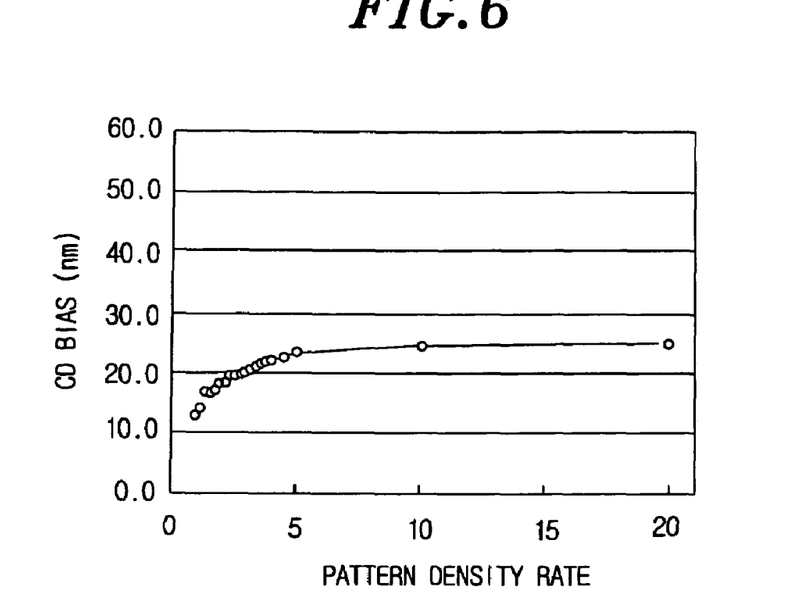
FIG. 6 offers a graph showing a relationship between a pattern density and a CD bias at the end of a first process of the etching method in accordance with the first embodiment.
Figure 7:
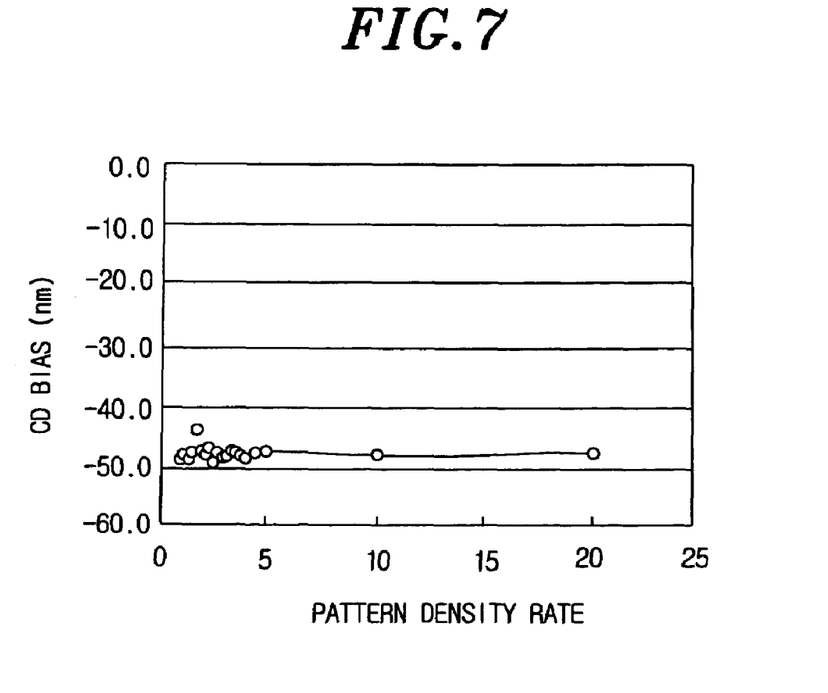
FIG. 7 sets forth to a graph showing a relationship between a pattern density and a CD bias at the end of a second process of the etching method according to the first embodiment.

FIG. 6 offers results obtained by measuring CD shifts (CD biases) when the first process of the etching method in accordance with the present embodiment is performed on a sample wafer having a plurality of pattern density regions (line and space pattern 1:1, 1:1.2, 1:1.4, . . . , 1:5, 1:10, and 1:20). FIG. 7 shows results obtained by measuring CD biases when the second process of the etching method in accordance with the present embodiment is performed on the same sample wafer. In this sample, the pattern density is the highest in a region where line and space ratio is 1:1 (in which a ratio of a line width to a gap is 1:1), and the pattern density is the lowest in a region where line and space ratio is 1:20 (in which a ratio of a line width to a gap is 1:20).

As clearly shown in FIG. 6, a pattern width of a mask layer pertaining to a low pattern density region increases at a higher rate compared to that of a mask layer pertaining to a high pattern density region. For example, in the 1:1 line and space pattern region, the pattern width of the mask layer increases from the initial value by about 13 nm, while in the 1:20 line and space pattern density region, that of the mask layer increases from the initial value by as much as 25 nm. By performing the second process at this state, the pattern widths in all regions are reduced from the initial values by about 47 nm regardless of the pattern density. Namely, at the end of the second process, the pattern widths of the mask layers are adjusted to the substantially same value.

As described above, in accordance with the etching method of the present embodiment, even in case where many pattern density regions exist on a mask layer of a single wafer, uniform pattern widths of the mask layer can be obtained. A target layer (a layer to be etched) can be etched using this mask layer.

Although the present embodiment has described an example in which the line and space patterns are formed on the mask layer, contact hole patterns may be formed in the mask layer as well. In this case, by depositing plasma reaction products on the inner walls of the contact hole patterns of the mask layer in the first process, fine contact holes having smaller diameters can be formed in a layer to be etched.

Second Embodiment

Next, a second embodiment of the present invention will be described with reference to the attached drawings. In the example of the first embodiment shown in FIG. 3A, the pattern width L120 of the mask layer 212-2 pertaining to the second region reg12 (low pattern density region) was narrower than the pattern width L110 of the mask layer 212-1 pertaining to the first region reg11 (high pattern density region). However, when the photolithography process is performed on the mask layer 212 and the mask layer 212 is patterned, the opposite phenomenon may occur. Namely, as shown in FIG. 8A, a pattern width L220 of a mask layer 212-2 pertaining to a second region reg22 (low pattern density region) may be wider than a pattern width L210 of a mask layer 212-1 pertaining to a first region reg21 (high pattern density region).

Figure 8A:
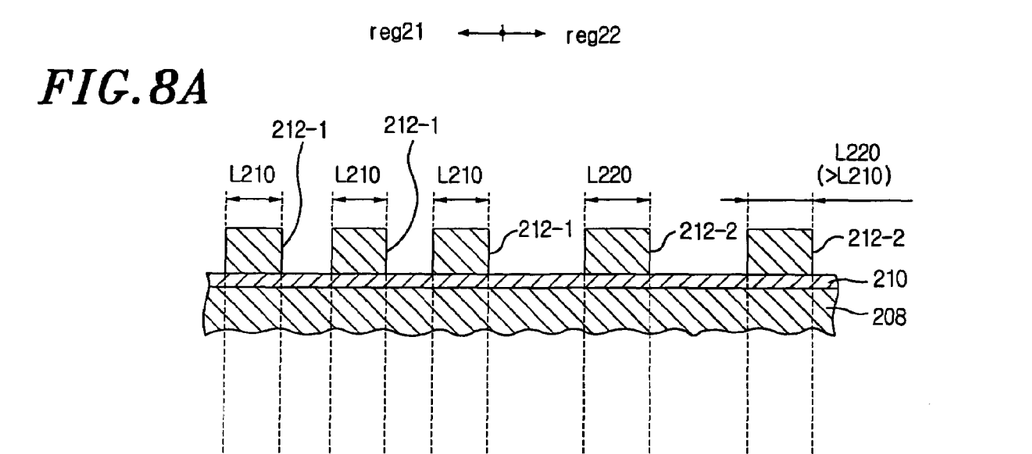
FIGS. 8A through 8C are schematic cross sectional views of target objects, to which an etching method in accordance with a second embodiment is applied, in processes.

Accordingly, the second embodiment describes an example, in which, even though a difference shown in FIG. 8A exists in pattern widths of a mask layer 212 patterned by using the photolithography process, the difference can be eliminated and circuits can be uniformly formed over the entire wafer.

As in the first embodiment, a plasma etching process is performed, in the present embodiment, selectively on a BARC 210 (a layer to be etched) disposed below the mask layer 212 using the mask layer 212 as a mask. The plasma etching process is performed in at least two processes (first and second processes) having different processing conditions.

Figure 8B:
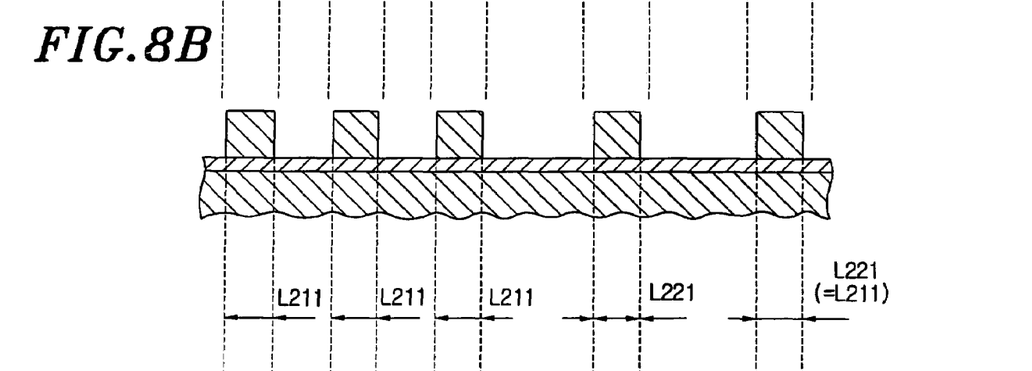

First, a trimming, in which a patterned mask layer 212 is transversely etched, is carried out in a first process. By doing this, each pattern width of the mask layer are reduced. The processing conditions are set such that the pattern width L210 of the mask layer 212-1 pertaining to the first region reg21 becomes the same as the pattern width L220 of the mask layer 212-2 pertaining to the second region reg22 at the end of the first process. An example of detailed conditions of the first process is described below. Further, the BARC 210 of a target layer, which is masked by the mask layer 212, is scarcely etched in the first process.

processing gas: $O_2$ (flow rate 70 sccm)
inner pressure of chamber: 10 mTorr
high frequency power to be applied to upper electrode: 200 W
high frequency power to be applied to lower electrode: 0 W
He gas pressure (center/edge): 3/3 Torr
temperature inside chamber (top/wall/bottom): 80/60/30° C.
etching time: 35.6 sec When the first process is performed under the above-described process conditions, the pattern width L210 of the mask layer 212-1 pertaining to the first region reg21 is reduced to a pattern width L211, and the pattern width L220 of the mask layer 212-2 pertaining to the second region reg22 is reduced to a pattern width L221, as shown in FIG. 8B. However, the trimming amount to the mask layer 212-2 pertaining to the second region reg22 is larger and the reduction rate of the pattern width thereof is higher. As a result, the pattern width L210 of the mask layer 212-1 pertaining to the first region reg21 and the pattern width L220 of the mask layer 212-2 pertaining to the second region reg22, which were different from each other at an initial state, are changed to the pattern width L211 and the pattern width L221 (=L211) of same size at the end of the first process.

Figure 9:
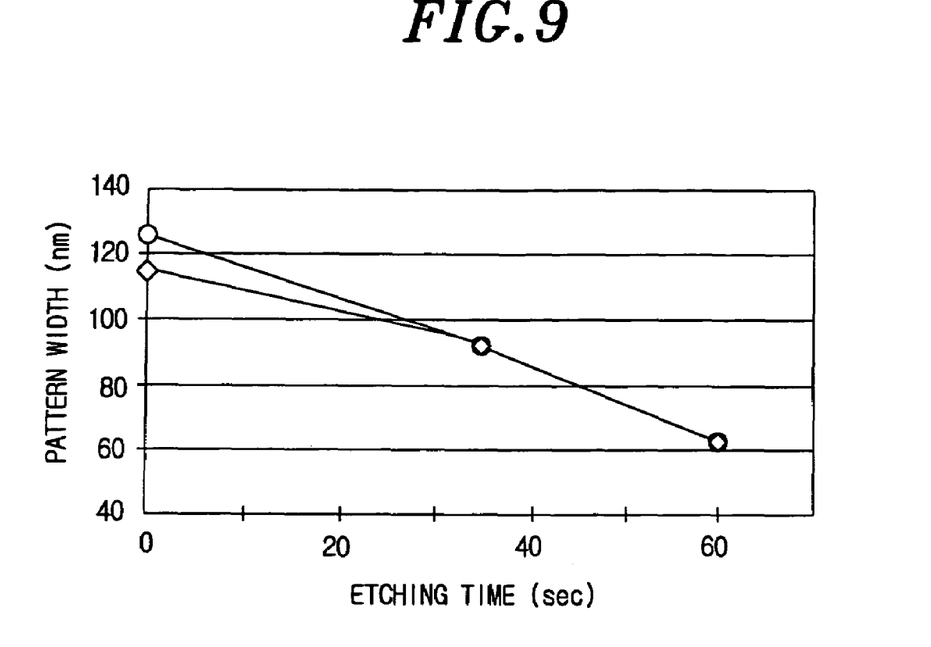
FIG. 9 is a graph showing a relationship between an etching time and a pattern width when the etching method in accordance with the second embodiment is performed.

FIG. 9 illustrates a relationship between an etching time ("trimming time" in the first process) and the pattern widths of the mask layer 212. In FIG. 9, the line showing pattern width of the mask layer 212-1 pertaining to the first region reg21 is plotted with ◇, while the line showing pattern width of the mask layer 212-2 pertaining to the first region reg22 is plotted with ○. As shown in FIG. 9, the pattern width of the mask layer 212-1 catches up with that of the mask layer 212-2 when an etching time of 35.6 sec has elapsed. The etching time of the first process (35.6 sec) can be determined based on the same method as in the first process of the first embodiment.

A pattern width (an initial value) of a mask layer is measured in advance by using a wafer sample having the same film structure. Then, a first process is performed under the same processing conditions, and stopped after an appropriate time to measure the pattern width of the mask layer. A difference between a measured patterned width and the initial value is obtained. Next, increasing rates (slopes of plotted segments) in the pattern widths of the mask layer in the first process are calculated by using this difference in pattern width and the processing time. Since, in the present embodiment, a mask layer pertaining to a high pattern density region and a mask layer pertaining to a low pattern density region are different in reduction rates of pattern widths, the lines of the pattern widths of the mask layers are bound to meet with each other after an elapse of a certain time (the segments intersect each other). The elapsed time is set to a first processing time. In the present embodiment, the first processing time is 35.6 sec. By changing various process parameters, the etching time (first processing time) can be adjusted.

Figure 10:
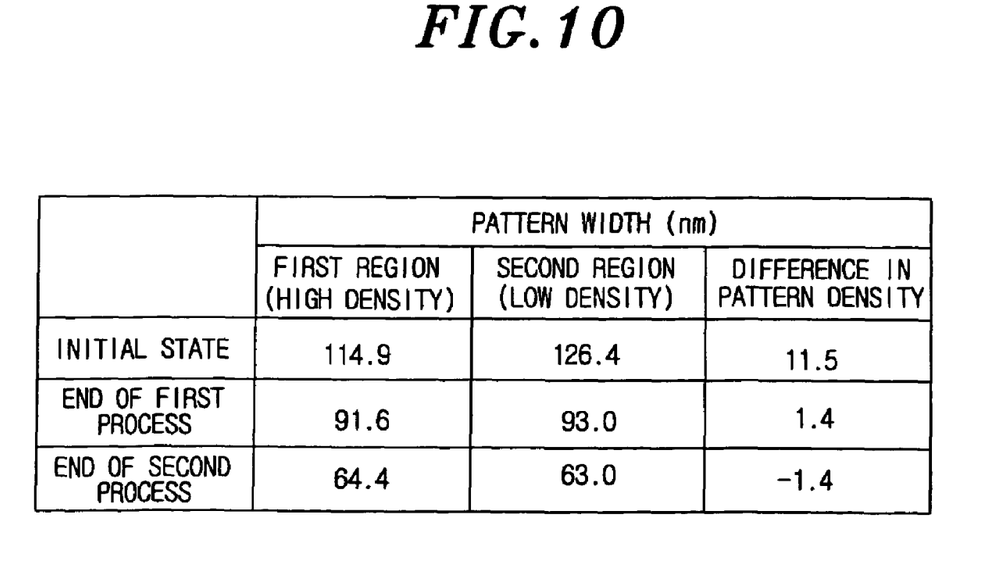
FIG. 10 provides a table showing results obtained by measuring pattern widths that have been changed by performing the etching method in accordance with the second embodiment.

FIG. 10 shows results obtained by measuring the pattern widths of the mask layer 212-1 pertaining to the first region reg21 and the mask layer 212-2 pertaining to the second region reg22.

At an initial state, i.e., when the photolithography process is completed, the pattern width L210 of the mask layer 212-1 pertaining to the first region reg21 is 114.9 nm, while the pattern width L220 of the mask layer 212-2 pertaining to the second region reg22 is 126.4 nm, that is, relatively wide. The difference therebetween is 11.5 nm.

If the first process of the etching method in accordance with the present embodiment is performed, the pattern width L210 of the mask layer 212-1 pertaining to the first region reg21 is reduced to 91.6 nm (L211), while the pattern width L220 of the mask layer 212-2 pertaining to the second region reg22 is reduced to 93.0 nm (L221). At this time, since the reduction rate in the pattern width of the mask layer 212-2 pertaining to the second region reg22 is larger than that in the pattern width of the mask layer 212-1 pertaining to the first region reg21, the difference between the two pattern widths becomes 1.4 nm. This difference value is so small that the pattern width L211 of the mask layer 212-1 pertaining to the first region reg21 can be regarded as being substantially equal to the pattern width L221 of the mask layer 212-2 pertaining to the second region reg22.

As descried above, at the end of the first process, the pattern widths of the mask layer 212 are made uniform regardless of the pattern density. Further, in following second process, the BARC 210 is etched using the mask layer 212, on which the pattern widths are made uniform, as a mask.

In the second process, in addition to the longitudinal etching of BARC 210, further reduction of the pattern widths of the mask layer 212, which were reduced in the first process, is also performed. Namely, the trimming is also performed on the mask layer 212. The trimming is performed according to the pattern width of the mask layer 212 at the end of the first process. For example, in case where each pattern width, which was reduced in the first process, is wider than that of a finally desired circuit pattern of the semiconductor device, the trimming is preferably carried out. In the present embodiment, the etching process on the BARC 210 and the trimming on the mask layer 212 are performed together.

The process conditions of the second process are set in view of not only the etching process on the BARC 210 but also the requirement that the pattern width of the mask layer 212-1 pertaining to the first region reg21 and that of the mask layer 212-2 pertaining to the second region reg22 be reduced at the same rate, unlike the aforementioned first process, in case where the trimming is carried out on the mask layer 212 in the second process. An example of detailed conditions of the second process is described below.

processing gas: $CF_4$ (flow rate 40 sccm)+$O_2$ (flow rate 40 sccm)

inner pressure of chamber: 20 mTorr high frequency power to be applied to upper electrode: 600 W high frequency power to be applied to lower electrode: 100 W overetching: 10%

Further, in the second process, after the exposure of a base layer disposed below the BARC 210 (here, the hard mask layer 208) is detected, 10% overetching is performed as described above and the etching process is completed.

Figure 8C:
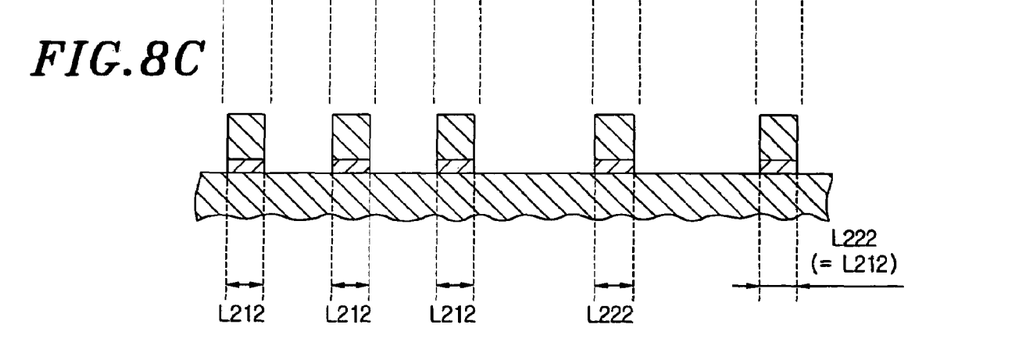

When the second process is performed under the above-described process conditions, the pattern width L211 of the mask layer 212-1 pertaining to the first region reg21 is reduced to a pattern width L212, and the pattern width L221 of the mask layer 212-2 pertaining to the second region reg22 is reduced to a pattern width L222, as shown in FIG. 8C. Further, the reduction rate is uniform regardless of the pattern density of the mask layer 212. As a result, the pattern width L212 and the pattern width L222 remains the same as to each other at the end of the second process.

Further, in the second process, the BARC 210 is etched using the mask layer 212-1 having the pattern width L212 and the mask layer 212-2 having the pattern width L222 as masks. Therefore, the pattern widths of the BARC 210 are uniform over an entire wafer regardless of the pattern density.

Here, FIGS. 9 and 10 are referred to again. As shown in FIG. 9, the pattern width reduced in the first process is further reduced at a uniform rate regardless of the pattern density. When the second process is completed, the pattern width of the mask layer 212-1 (and the BARC 210) and that of the mask layer 212-2 (and the BARC 210) are the same.

FIG. 10 shows results obtained by measuring the pattern width L212 of the mask layer 212-1 pertaining to the first region reg21 and the pattern width L222 of the mask layer 212-2 pertaining to the second region reg22. If the second process of the etching method according to the present embodiment is performed, the pattern width of the mask layer 212-1 pertaining to the first region reg21 is reduced to 64.4 nm and that of the mask layer 212-2 pertaining to the second region reg22 is reduced to 63.0 nm. Thus, the difference between the pattern widths becomes −1.4 nm. This value is so small that the pattern width L212 of the mask layer 212-1 pertaining to the first region reg21 can be regarded as being substantially equal to the pattern width L222 of the mask layer 212-2 pertaining to the second region reg22.

As described above, in accordance with the etching method of the second embodiment, the pattern widths of the mask layer 212 are reduced in the first process, and further reduced to a predetermined value in the second process. Particularly, the pattern widths of the mask layers 212 are reduced at different rates according to the pattern density in the first process until the pattern widths of the mask layers 212 become uniform regardless of the pattern density. Accordingly, even in case where the pattern widths of the mask layer 212 are different due to the pattern density at the initial state, the pattern widths of the BARC 210 can be uniformly adjusted finally.

Further, in accordance with the etching method of the second embodiment, even though each of the pattern widths of the mask layer 212 has a large CD shift at the initial state, the pattern width of the mask layer 212 can be adjusted to a design value by performing the first and the second process. As a result, extremely fine circuit patterns can be formed and dimensional errors of the circuit patterns can be suppressed to minimum.

In general, it is difficult to pattern a mask layer at a width of 100 nm or less without deviation using a photolithography technology. Nowadays, the pattern width required by specifications is about to reach a limit level that the photolithography technology can support. From this point of view, in accordance with the present invention, the mask layer 212 and the BARC 210 are patterned at an ultra fine CD (e.g., 70 nm or less) that cannot be achieved by the photolithography technology.

Meanwhile, in the first process of the second embodiment, $O_2$ gas is used as a processing gas at the state where a bias power is not applied. When the bias power is not applied, $CF_4$ gas+$O_2$ gas may also be used as a processing gas. However, the simple use of the $O_2$ gas can increase a ratio of the transverse etching amount of the mask layer to the longitudinal etching amount of the mask layer, thus reducing the longitudinal etching of the mask layer relatively. Accordingly, the simple use of the $O_2$ gas is preferred when the bias power is not applied.

Although the preferred embodiments of the present invention have been described with reference to the attached drawings, the present invention is not limited to these embodiments. It will be understood by those skilled in the art that various changes and modifications may be made without departing from the spirit and scope of the invention as defined in the following claims.

For example, although, in the first process, $CHF_3$ gas has been described as being used as the processing gas in the description of the etching method in accordance with the first embodiment, the present invention is not limited thereto. Other CHF based gas, CF based gas, CH based gas, and the like, and mixture of these gases may be used as the processing gas as well. Namely, other processing gases capable of depositing reaction products on the sidewalls of the mask layer may be used. An example of such gas applicable to the present invention is described below.

As the CF based gas, $CF_4$, $C_2F_4$, $C_2F_6$, $C_3F_6$, $C_3F_8$, $C_4F_6$, $C_4F_8$ (cyclo/aliphatic), $C_5F_8$ (cyclo/aliphatic), $C_5F_{10}$, and the like may be cited, for example.

As the CHF based gas, e.g., $CHF_3$, $CH_2F_2$, $CH_3F$, $C_2H_2F_4$, $C_2H_6F$, and the like may be cited, for example.

As the CH based gas, e.g., $CH_4$, $C_2H_6$, $C_3H_8$, $C_2H_4$, other unsaturated hydrocarbon gas and $C_3H_6$ may be cited.

Although both the $CF_4$ gas and the $O_2$ gas are used in the second processes of the first and the second embodiment, single use of $CF_4$ gas is also possible.

For example, in the second embodiment, the first process is performed under the aforementioned process conditions that the $O_2$ gas is used as the processing gas and a high frequency power of 0 W is applied to the lower electrode (no bias power), and then, the second process is performed under the condition that the $CF_4$ gas is used as the processing gas. The process conditions of the second process are the same as, e.g., those of the second embodiment except for the processing gas. In this case, the longitudinal etching amount of the mask layer 212 can be reduced in addition to the fact that finally formed pattern widths of the BARC 210 can be uniformly adjusted as described above. Further, the difference between the pattern width of the mask layer 212 and that of the BARC 210 after etching can be reduced.

Figure 13:
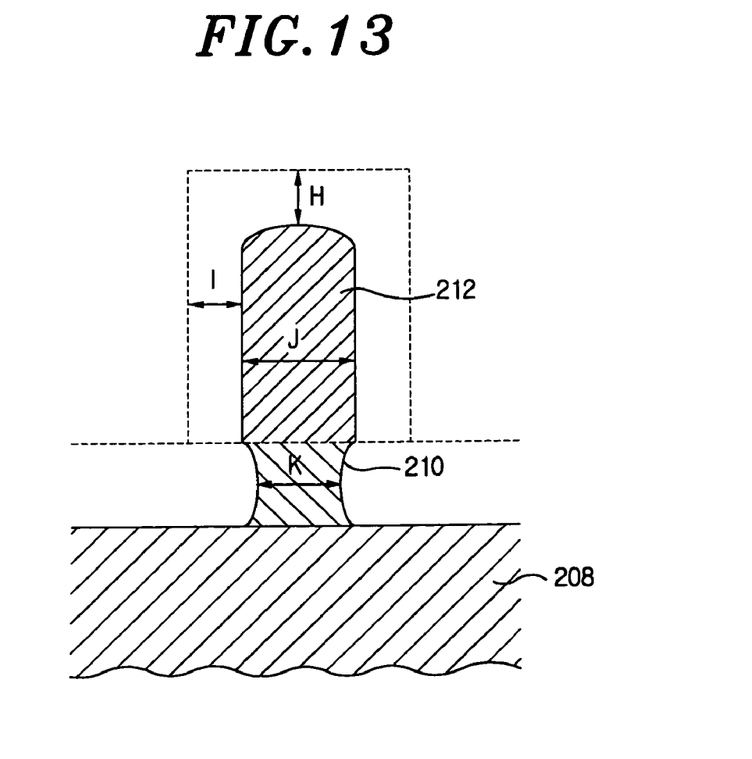
FIG. 13 offers an illustrative view showing shapes of a mask layer and a BARC after etching.

Here, the aforementioned effects are verified in the case where the $CF_4$ gas is used as the processing gas in the second process. For example, as shown in FIG. 13, when the BARC 210 is etched using the mask layer 212 as a mask, the pattern width of the mask layer 212 is not only reduced but also etched in the longitudinal direction thereof. Since the etching rate of the BARC 210 is higher than that of the mask layer 212, the pattern width of the BARC 210 tends to be narrower than that of the mask layer 212. In FIG. 13, H represents the longitudinal etching amount of the mask layer 212 at the time of etching, and I represents the transverse etching amount of the pattern of the mask layer 212 at the time of etching. J represents the pattern width of the mask layer 212 after etching, and K represents that of the BARC 210 after etching.

In accordance with the experiments conducted by the present inventor, e.g., when the BARC 210 was etched using both the $CF_4$ gas and the $O_2$ gas as the processing gas through only a single process unlike the etching method of the above-described embodiments, I/H ratio was 0.40 and K/J ratio was 0.69 in a shape after being etched. On the other hand, when the $CF_4$ gas alone was used as the processing gas in the second process of the second embodiment, I/H ratio was 0.67 and K/J ratio was 0.76. I/H ratio is a ratio of the transverse etching amount of the mask layer 212 to the longitudinal etching amount of the mask layer 212, and represents the degree to which the mask layer 212 is longitudinally etched when the pattern width of the mask layer 212 is reduced by a specific amount. Therefore, I/H ratio is the basis a criterion for measuring the longitudinal etching amount of the mask layer 212. On the other hand, since K/J ratio is a ratio of the pattern width of the BARC 210 to that of the mask layer 212, K/J ratio is a basis for measuring the difference between both pattern widths.

From these experiments, it can be appreciated that, in case where the $CF_4$ gas alone was used as the processing gas in the second process, I/H ratio considerably increased from 0.40 to 0.67 and the longitudinal etching amount of the mask layer 212 was reduced. In this case, as the thickness of the mask layer is secured at the time of etching, the mask layer sufficiently may serve as the mask of a film to be etched, thus improving etching characteristics.

Further, from these experiments, it can be noted that, in case where the $CF_4$ gas alone was used as the processing gas in the second process, K/J ratio considerably increased from 0.69 to 0.76 and the difference between the pattern width of the mask layer 212 and that of the BARC 210 was reduced. In this case, stability of the patterns of the mask layer standing upright on the BARC is improved, so that the pattern upsetting of the mask layer can be prevented.

Still further, although, the $CF_4$ gas was used as the processing gas in the second process of the second embodiment, the same effects can be obtained even though the $CF_4$ gas is used in the second process of the first embodiment. In case where the $CF_4$ gas is used in the first embodiment, the $CF_4$ gas may be used as the processing gas for increasing the pattern width of the mask layer in the first process, and may be used as the process gas for reducing the longitudinal etching amount of the mask layer and reducing the difference between the pattern widths of the mask layer and the BARC in the second process. In case of using the $CE_4$ gas, an etching rate of a film to be etched and a dimension of a pattern width can be freely controlled by the change of process conditions. For example, in case where an inner pressure of a processing vessel is low; a flow rate of the $CF_4$ gas is high; and a high frequency power for producing a plasma is increased in the first process, the etching rate of the film to be etched is reduced. Accordingly, plasma reaction products are deposited, so that the pattern width of the mask layer can be increased. Further, by appropriately setting process conditions in the second process, etching can be performed to suppress the reduction amount of the pattern widths of the film to be etched and the mask layer while suppressing a longitudinal reduction in the pattern of the mask layer.

Although, in the aforementioned embodiments, the etching process of the first process has been performed for a predetermined set time, the first process may be completed when a corresponding pattern width reaches a target dimension, by monitoring the pattern width of the mask layer during the etching process of the first process.

In this case, for example, a surface structure measurement device capable of measuring the surface structure of the mask layer using scatterometry may be installed inside the plasma processing apparatus 101. Further, during the etching process of the first process, the pattern widths of the first region where the pattern density of the mask layer 212 is relatively high, and the second region where the pattern density thereof is relatively low are continuously measured and monitored by the surface structure measurement device. The etching process of the first process is completed when the pattern widths of the first and the second region reach a target value and coincide with each other. By doing this, the pattern widths of the mask layer 212 certainly can be made uniform.

The aforementioned process conditions may be preferably controlled by the controller 110 in a fully automated manner as described above in connection with the plasma processing apparatus 101.

The present invention can be applied to an etching method of converting a processing gas into a plasma and performing an etching process on an object to be processed.

In accordance with the present invention, it is possible to etch a target layer to be masked by a mask layer, while adjusting pattern widths of the mask layer. As a result, the target layer is patterned at a predetermined width. Further, in accordance with the present invention, even in case where mask layers having different pattern densities exist in the same wafer and pattern widths of mask layers patterned through a photolithography process are uneven according to pattern densities, each pattern width of the mask layers can be made uniform. Accordingly, the pattern widths of the layer can be made uniform over an entire wafer.

While the invention has been shown and described with respect to the preferred embodiments, it will be understood by those skilled in the art that various changes and modifications may be made without departing from the spirit and scope of the invention as defined in the following claims.

What is claimed is:

1. An etching method comprising the steps of:
a first process for increasing pattern widths of a pre-patterned mask layer by depositing plasma reaction products on sidewalls of the mask layer, wherein the pre-patterned mask layer includes patterns having different widths, and the widths of the patterns are increased by the first process to be substantially identical to each other; and
a second process for etching a layer to be etched by using the mask layer as having the increased pattern widths as a mask.

2. An etching method comprising the steps of:
a first process for increasing pattern widths of a pre-patterned mask layer by depositing plasma reaction products on sidewalls of the mask layer; and
a second process for etching a layer to be etched by using the mask layer having the increased pattern widths as a mask,
wherein the mask layer includes a first and a second region where patterns in the first region are disposed closer to each other than those in the second region, and widths of the patterns in the first region differ from those in the second region; and
wherein the first process is performed by widening the widths of the patterns in the first and the second region such that the widths of the patterns in the first region substantially coincide with those in the second region.

3. The etching method of claim 2, wherein the second process is performed by etching the layer to be etched while reducing the pattern widths of the mask layer by etching the sidewalls thereof.

4. The etching method of claim 2, wherein a processing gas of the first process includes at least any one of a CF based gas, a CHF based gas and a CH based gas.

5. The etching method of claim 4, wherein the processing gas is $CHF_3$.

6. The etching method of claim 2, wherein the mask layer is made of a photoresist material.

7. The etching method of claim 6, wherein the photoresist material is photosensitive to an ArF light.

8. The etching method of claim 2, wherein the layer to be etched is formed of a bottom anti-reflection layer.

9. The etching method of claim 8, wherein the bottom anti-reflection layer is made of an organic material.

10. The etching method of claim 2, wherein a processing gas of the second process is a $CF_4$ gas and an $O_2$ gas.

11. The etching method of claim 2, wherein a processing gas of the second process is a $CF_4$ gas.

12. The etching method of claim 2, wherein the mask layer is provided with contact hole patterns.

13. The etching method of claim 2, wherein the first process is completed when corresponding pattern widths reach a target value by monitoring the pattern widths of the mask layer in the first process.

14. An etching method comprising the steps of:
a first process for etching sidewalls of a pre-patterned mask layer to produce a processed mask layer with reduced pattern widths;
a second process for etching by using the processed mask layer as a mask a layer to be etched while further reducing the pattern widths of the processed mask layer by etching sidewalls thereof,
wherein the mask layer includes a first and a second region where patterns in the first region are disposed closer to each other than those in the second region, and widths of the patterns in the first region differ from those in the second region; and
wherein the first process is performed by narrowing the widths of the patterns in the first and the second region such that the widths of the patterns in the first region substantially coincide with those in the second region.

15. An etching method comprising the steps of:
reducing pattern widths of a pre-patterned mask layer having patterns of different widths by etching sidewalls of the mask layer such that the widths of the patterns substantially coincide with each other; and
by using the mask layer having the reduced pattern widths as a mask, etching a layer to be etched while further reducing the pattern widths of the mask layer by etching sidewalls thereof.

* * * * *